(12) United States Patent
Ou et al.

(10) Patent No.: US 8,772,933 B2
(45) Date of Patent: Jul. 8, 2014

(54) INTERCONNECT STRUCTURE AND METHOD OF MAKING SAME

(75) Inventors: Ya Ou, Troy, NY (US); Shom Ponoth, Clifton Park, NY (US); Terry A. Spooner, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 693 days.

(21) Appl. No.: 11/954,812

(22) Filed: Dec. 12, 2007

(65) Prior Publication Data

US 2009/0152723 A1    Jun. 18, 2009

(51) Int. Cl.
*H01L 23/48* (2006.01)
(52) U.S. Cl.
USPC ............ 257/751; 257/635; 257/632; 438/627
(58) Field of Classification Search
CPC .............. H01L 23/53; H01L 23/53238; B81C 2201/0107; B81C 2201/0109
USPC ............ 333/12; 427/569; 438/622, 633, 637, 438/618, 648, 706; 257/E23.019, 522, 257/635–758
See application file for complete search history.

(56) References Cited

U.S. PATENT DOCUMENTS

| | | | |
|---|---|---|---|
| 5,612,254 A | 3/1997 | Mu et al. | |
| 5,695,810 A * | 12/1997 | Dubin et al. | 438/643 |
| 5,767,687 A | 6/1998 | Geist | |
| 6,144,099 A * | 11/2000 | Lopatin et al. | 257/758 |
| 6,617,244 B2 | 9/2003 | Nishizawa | |
| 6,958,524 B2 * | 10/2005 | Li et al. | 257/635 |
| 2001/0026849 A1 * | 10/2001 | Yau et al. | 427/569 |
| 2003/0077897 A1 * | 4/2003 | Tsai et al. | 438/633 |
| 2004/0084412 A1 | 5/2004 | Waldfried et al. | |
| 2004/0175921 A1 * | 9/2004 | Cowley et al. | 438/622 |
| 2004/0238961 A1 * | 12/2004 | Cunningham | 257/758 |
| 2005/0079705 A1 * | 4/2005 | Takeuchi | 438/637 |
| 2006/0038630 A1 * | 2/2006 | Kawaguchi et al. | 333/12 |
| 2006/0040501 A1 * | 2/2006 | America et al. | 438/706 |
| 2008/0073748 A1 * | 3/2008 | Bielefeld et al. | 257/522 |
| 2008/0108219 A1 * | 5/2008 | Huebinger et al. | 438/618 |
| 2008/0197499 A1 | 8/2008 | Yang et al. | |
| 2008/0197500 A1 * | 8/2008 | Yang et al. | 257/758 |

OTHER PUBLICATIONS

Ten Eyck, G.; "Atomic Layer Deposition of Metals on Dielectric Substrates", Rensselaer Polytechnic Institute, NY, May 2007, p. 85.
Fortin, J et al.; "Chemical Vapor Deposition Polymerization, The Growth and Properties of Parylene Thin Films", Kluwer Academic Publishers, 2004, p. 80.

(Continued)

*Primary Examiner* — Eugene Lee
*Assistant Examiner* — Fang-Xing Jiang
(74) *Attorney, Agent, or Firm* — Catherine Ivers; Roberts Mlotkowski Safran & Cole, P.C.

(57) ABSTRACT

An interconnect structure and method of fabricating the same is provided. More specifically, the interconnect structure is a defect free capped interconnect structure. The structure includes a conductive material formed in a trench of a planarized dielectric layer which is devoid of cap material. The structure further includes the cap material formed on the conductive material to prevent migration. The method of forming a structure includes selectively depositing a sacrificial material over a dielectric material and providing a metal capping layer over a conductive layer within a trench of the dielectric material. The method further includes removing the sacrificial material with any unwanted deposited or nucleated metal capping layer thereon.

27 Claims, 7 Drawing Sheets

(56) References Cited

OTHER PUBLICATIONS

Office Action for related U.S. Appl. No. 13/415,159 dated Oct. 3, 2012.

Office Action for related U.S. Appl. No. 13/415,159 dated Apr. 15, 2013, 26 pages.

Final Office Action dated Oct. 23, 2013 in related U.S. Appl. No. 13/415,159, 37 pages.

Notice of Allowance dated Mar. 3, 2014 in related U.S. Appl. No. 13/415,159, 9 pp.

* cited by examiner

INTERCONNECT STRUCTURE AND METHOD OF MAKING SAME

FIELD OF THE INVENTION

The present invention relates generally to an interconnect structure and method of fabricating the same and, more particularly, to a defect free capped interconnect structure and method of fabricating the same.

BACKGROUND OF THE INVENTION

Electromigration is the transport of material caused by the gradual movement of ions in a conductor due to the momentum transfer between conducting electrons and diffusing metal atoms. The effect of electromigration is an important consideration to take into account in applications where high direct current densities are used, such as in microelectronics and related structures. In fact, electromigration is known to decrease the reliability of integrated circuits (ICs) and hence lead to a malfunction of the circuit. In the worst case, for example, electromigration leads to the eventual loss of one or more connections and intermittent failure of the entire circuit.

The current density in interconnect structures increases due to scaling of the structures. This increased current density degrades EM (electromigration) related reliability. As such, as the structure size in ICs decreases, the practical significance of the EM effect increases. Thus, with increasing miniaturization the probability of failure due to electromigration increases in VLSI and ULSI circuits because both the power density and the current density increase. Also, it is know that in advanced semiconductor manufacturing processes, copper is used as the interconnect material which is subject to EM. Basically, copper is preferred for its superior conductivity.

In conventional structures, a metal cap is formed over the copper in an attempt to minimize copper migration, i.e., increase EM lifetime. The metal cap is formed by a selective electroless metal cap deposition process using, for example, CoWP. Although the selective electroless metal cap deposition process is selective to copper, unwanted deposition and/or rogue nucleation of the CoWP still results on the surface of the interlevel dielectric of the structure. That is, although the process is selective to copper, there is still a low deposition rate of the CoWP on the surface of the interlevel dielectric. This, in turn, results in high leakage and poor time dependent dielectric breakdown. In fact, the unwanted deposition and/or rogue nucleation can cause device failure due to shorting between adjacent copper lines.

Accordingly, there exists a need in the art to overcome the deficiencies and limitations described hereinabove.

SUMMARY OF THE INVENTION

In a first aspect of the invention, a structure comprises a conductive material formed in a trench of a planarized dielectric layer which is devoid of cap material. The structure further includes the cap material formed on the conductive material to prevent migration.

In embodiments, the cap material is one of CoWB and CoWP. A liner extends about portions of the conductive material within the trench. The liner is tantalum, tantalum nitride, titanium, titanium nitride, Ruthenium or a combination thereof or doped variations of these (such as with Iridium). The planarized dielectric layer is silicon oxide, carbon doped oxide, SiCxOyHz or a porous dielectric material. The conductive material is precleaned copper.

In further embodiments, a sacrificial material selective to the dielectric layer is deposited on the dielectric layer. The sacrificial material is etched back over the conductive material such that the conductive material is free of the sacrificial material. The sacrificial material has a ratio of deposition rate on the dielectric layer to a deposition rate on copper of about 2 or greater. The sacrificial material is hydrophobic. The sacrificial material is a variety of polyxylylene polymers or a variety of silylating agents. The sacrificial material prevents unwanted deposition and/or rogue nucleation of the cap material on the dielectric layer.

In another aspect of the invention, an intermediate structure comprises a first dielectric layer having a trench filled with conductive material and a second dielectric layer formed over the first dielectric layer. The second dielectric layer has a via and trench filled with the conductive material and lined with a liner and devoid of unwanted deposition or nucleation of capping material. The capping material is on the conductive material. A cap layer separates the first dielectric layer and the second dielectric layer. A sacrificial layer is placed on the second dielectric layer which prevents the capping material from depositing on the second dielectric layer.

In embodiments, the liner is tantalum, tantalum nitride, titanium, titanium nitride, Ruthenium or a combination thereof or doped variations of these (such as with Iridium). The conductive material is precleaned copper. The sacrificial material has a ratio of deposition rate on the second dielectric layer to a deposition rate on the conductive material of about 2 or greater. The sacrificial material is at least one of: hydrophobic and has silylating agents, and a variety of polyxylylene polymers. The sacrificial material prevents unwanted deposition and/or rogue nucleation of the capping material on the second dielectric layer.

In another aspect of the invention, a method of forming a structure comprises selectively depositing a sacrificial material over a dielectric material and providing a metal capping layer over a conductive layer within a trench of the dielectric material. The method further includes removing the sacrificial material with any unwanted deposited or nucleated metal capping layer thereon.

In embodiments, the removing of the sacrificial material is one of: a UV assisted thermal composition process, followed by a solvent or water rinse; a thermal decomposition process followed by a solvent or water rinse; and a reducing plasma etch followed by a solvent or water rinse. The removing of the sacrificial layer does not significantly chemically damage the dielectric material, the conductive layer or a liner. The depositing of the sacrificial material is selective to the dielectric material.

In another aspect of the invention, a method of manufacturing a structure comprises forming a layered structure of a first dielectric material with a first metal wire and a second dielectric material with a second metal wire and extending to the first metal wire. The method includes selectively depositing a sacrificial material over the second dielectric material and depositing a metal capping layer over the second metal wire which causes unwanted depositing and/or nucleation of the metal capping layer on the sacrificial material. The method further includes undercutting the unwanted deposited and/or nucleated metal capping layer from the sacrificial material.

In embodiments, the undercutting includes removing at least a portion of the sacrificial material. The removing is performed by one of: a UV assisted thermal composition process, followed by a solvent or water rinse; a thermal decomposition process followed by a solvent or water rinse; and a reducing plasma etch followed by a solvent or water rinse.

BRIEF DESCRIPTION OF THE DRAWINGS

The present invention is described in the detailed description which follows, in reference to the noted plurality of drawings by way of non-limiting examples of exemplary embodiments of the present invention, in which.

DETAILED DESCRIPTION OF EMBODIMENTS OF THE INVENTION

The present invention relates generally to an interconnect structure and method of fabricating the same and, more particularly, to a defect free capped interconnect structure and method of fabricating the same. By implementing the fabrication processes and structure in accordance with the invention, the copper interconnect is more reliable than conventional structures and hence is not prone to failure due to shorting, e.g., shorting between copper wires as a result of nucleation.

For example, advantageously, by implementing the fabrication processes and structure in accordance with the invention, the surface of the interlevel dielectric is free of capping material such as, for example, CoWP or CoWB. That is, by implementing the fabrication processes of the invention, the resultant structure is free of unwanted deposition and/or rogue nucleation of the CoWP (or other capping material) on the surface of the interlevel dielectric. This, in turn, results in low leakage and increased time dependent dielectric breakdown lifetime.

Figure 1:
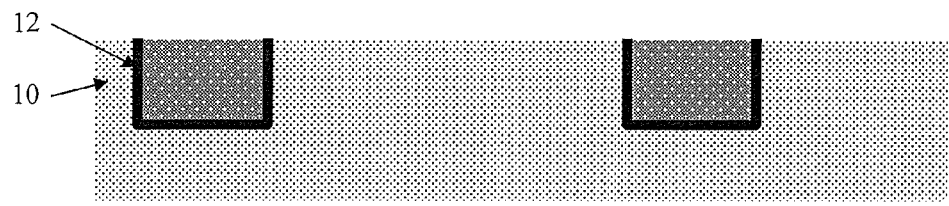
FIG. 1 shows a beginning structure and respective fabrication processes in accordance with the invention.

FIG. 1 shows a beginning structure and respective fabrication processes in accordance with the invention. More specifically, FIG. 1 shows a structure having a dielectric layer 10. The dielectric layer 10 can be, for example, any low k or ultra low k material such as, for example, silicon oxide, carbon doped oxide, $SiC_xO_yH_z$ or a porous ILD. In embodiments, the dielectric layer 10 may have a thickness ranging from, for example, about 500 Å to 10000 Å.

A metal (e.g., copper) wire 12 is formed in a trench of the dielectric layer 10 using a conventional processes. For example, in a conventional process, a photoresist layer (not shown) is formed over the dielectric layer 10 and exposed to form a pattern (using a hard mask). The photoresist layer may be, for example, an organic spin on layer. A reactive ion etching (RIE) process is performed to form the trench in the dielectric layer 10. A metal (e.g., copper) material is deposited into the trench to form the conductive wire 12 (e.g., copper wire). The structure is then planarized using a conventional process such as a chemical mechanical processing (CMP).

Figure 2:
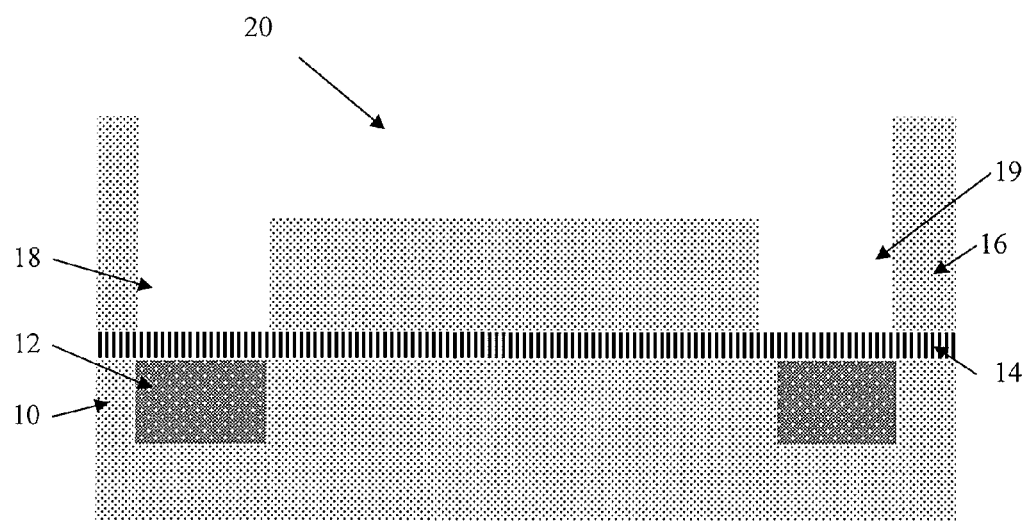
FIGS. 2-6 show intermediate structures and respective fabrication processes in accordance with the invention.

FIG. 2 shows an intermediate structure and respective fabrication processes in accordance with the invention. More specifically, FIG. 2 shows a cap layer 14 formed over the planarized dielectric layer 10 and the conductive wire 12. The cap layer 14 may be made from any conventional capping material such as, for example, silicon nitride or silicon carbide. The cap layer 14 can have a thickness that ranges from about 50 Å to 1000 Å.

An upper dielectric layer 16 is deposited over the lower cap layer 14, in a conventional process. In embodiments, the upper dielectric layer 16 may have a thickness ranging from, for example, about 500 Å to 10000 Å. The upper dielectric layer 16, much like the dielectric layer 10, can be, for example, any low k or ultra low k material such as, for example, silicon oxide, carbon doped oxide, $SiC_xO_yH_z$ or a porous ILD.

A via 18 and a via 19 are formed in the upper dielectric layer 16 using a conventional lithographic and etching process. For example, a photoresist (not shown) is formed over the upper dielectric layer 16 and exposed to form a pattern (using a hard mask). The photoresist layer may be, for example, an organic spin on layer. A reactive ion etching (RIE) process is performed to form the via 18 and the via 19 in the upper dielectric layer 16, which reaches to the cap layer 14.

A similar lithographic and RIE process is used to form a trench 20 in the upper dielectric layer 16. The trench 20 can range from about 250 Å to 5000 Å in thickness, and preferably about half way into the upper dielectric layer 16.

Figure 3:
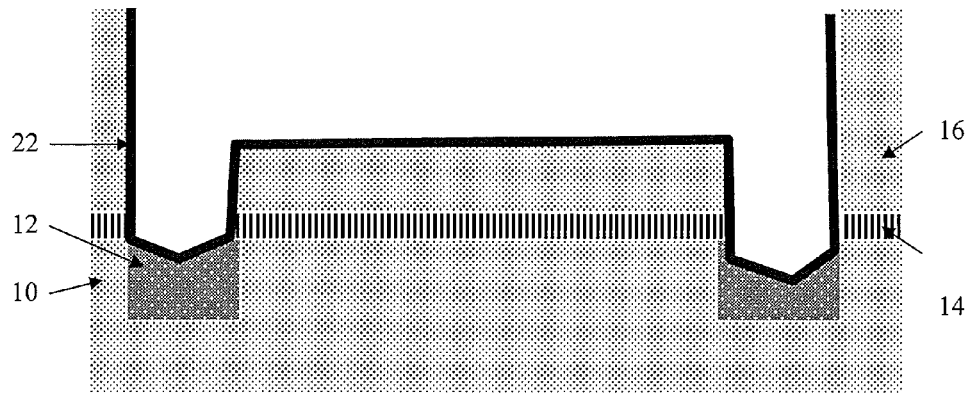

Referring to FIG. 3, a RIE is formed to open the cap layer 14 to the conductive wire 12. A sputter etch can be performed to etch into the conductive material (e.g., copper) of the conductive wire 12. This etching can also increase the depth of the trench 20. A liner material is deposited in the via 18, the via 19, and the trench 20 to form a liner 22. The liner material is deposited over and in contact with the conductive wire 12. The liner material can be, for example, tantalum, tantalum nitride, titanium, titanium nitride or Ruthenium. The liner material can be deposited using a conventional PVD (physical vapor deposition), CVD (chemical vapor deposition) or ALD (atomic layer deposition) process. The liner 22 can range in thickness from about 2 nm to 20 nm.

Figure 4:
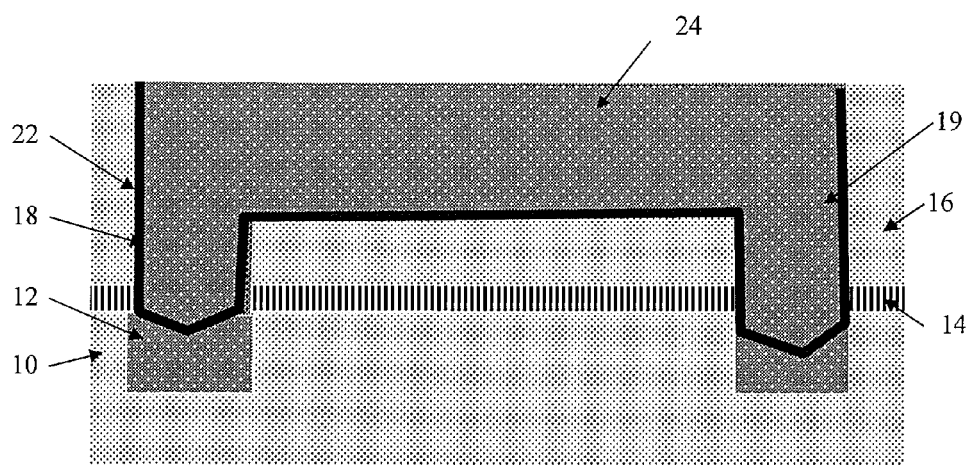

In FIG. 4, a copper seed layer is deposited over the liner 22. A copper plating may be performed over the copper seed layer to form a thicker copper layer 24, e.g., conductive wire. The copper layer 24 is planarized using a conventional process such as a chemical mechanical processing (CMP). In embodiments, the copper seed layer (or combination of the seed layer and plating) may range from about 25 Å to 700 Å.

In optional embodiments, a surface treatment of the structure of FIG. 4 can be provided to preclean the copper layer 24 (or conductive wire, hereinafter referred to as copper). For example, an ammonia preclean or high temperature treatment can be provided to remove any polymer residue on the copper. This precleaning process can increase the selectivity of a sacrificial material to the upper dielectric layer 16 that is deposited in subsequent processing steps.

Figure 5:
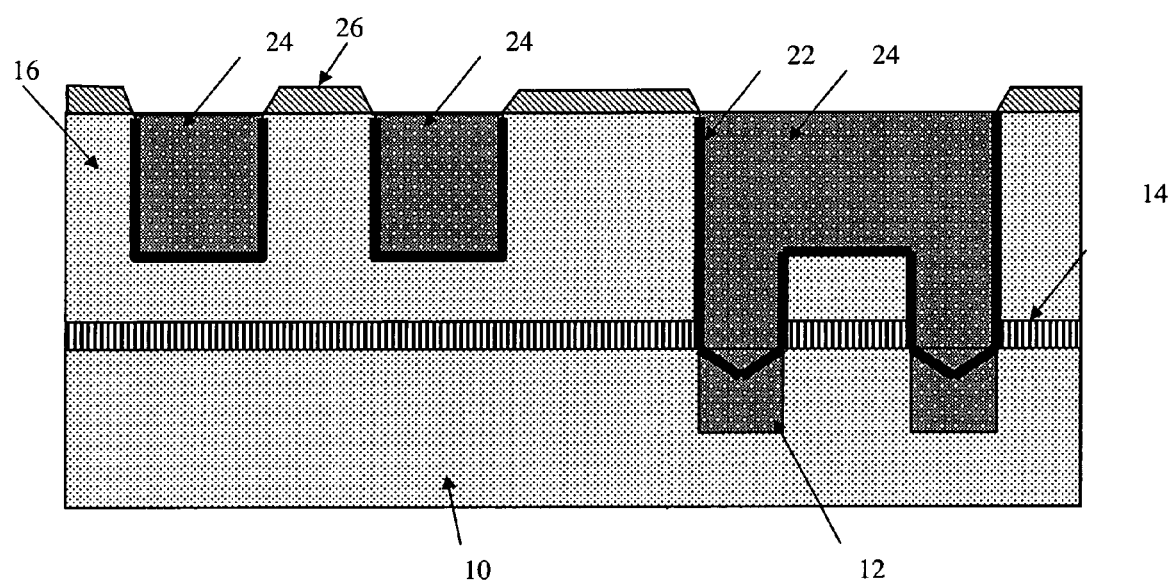

FIG. 5 shows a cross sectional view of the structure of FIG. 4 and further fabrication processes in accordance with the invention. In this view, several trenches filled with copper are shown in the upper dielectric layer 16. As further fabrication processes, a sacrificial material 26 selective to the upper dielectric layer 16 is deposited on the structure via a chemical deposition process at ambient temperature. In embodiments, a non-selective short etch back of the sacrificial material 26 is performed to ensure that the copper layer 24 is free of the sacrificial material 26. The non-selective etch back process can be a gas based chemical RIE. The sacrificial material 26 is about 1 Å to 500 Å in thickness.

In embodiments, the sacrificial material 26 has selective deposition properties to the dielectric material. In one contemplated example, the sacrificial material 26 has a ratio of deposition rate on the dielectric material to the deposition rate on copper is about 2 or greater.

A preferred sacrificial material 26 is hydrophobic. Examples of the sacrificial material are silylating agents such as Trimethylchlorosilane and Hexamethyldisilazane. In another example, the sacrificial material can be a variety of polyxylylene polymers such as, for example, Parylene™. Parylene is a polymer manufactured from di-p-xylene, a dimer of p-xylene. Di-p-xylene, more properly known as [2.2]paracyclophane, is made from p-xylene in several steps involving bromination, amination and elimination.

Figure 6:
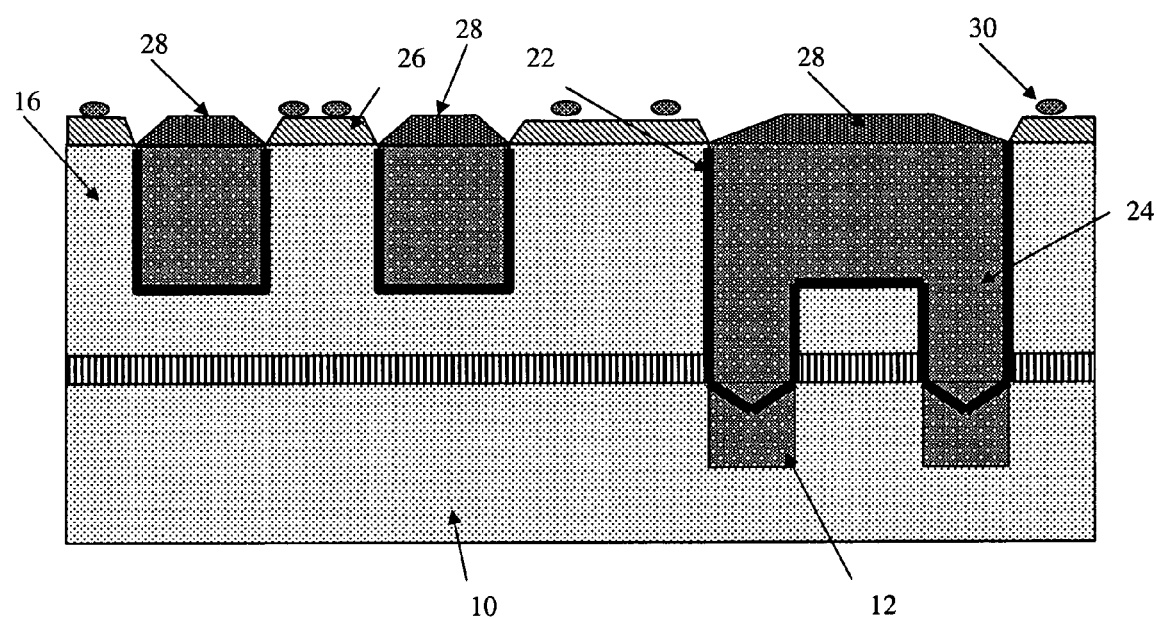

FIG. 6 shows an intermediate structure and respective fabrication processes in accordance with the invention. In FIG. 6, a selective electroless metal cap deposition process forms a cap layer 28 over the copper layer 24. The cap layer 28 may be, for example, CoWP or CoWB or other appropriate capping materials designed to prevent copper migration. In embodiments, any capping material that can be selectively deposited on copper is contemplated.

As shown in FIG. 6, during this deposition process unwanted deposition and/or rogue nucleation of CoWP or CoWB or other capping materials (generally represented at reference numeral 30) results on the surface of the sacrificial material 26. In embodiments, a decrease in the unwanted deposition and/or rogue nucleation, compared to conventional structures, is possible as the sacrificial material 26 is hydrophobic. However, as shown in FIG. 6, unwanted deposition and/or rogue nucleation does not form on the upper dielectric layer 16.

Figure 7:
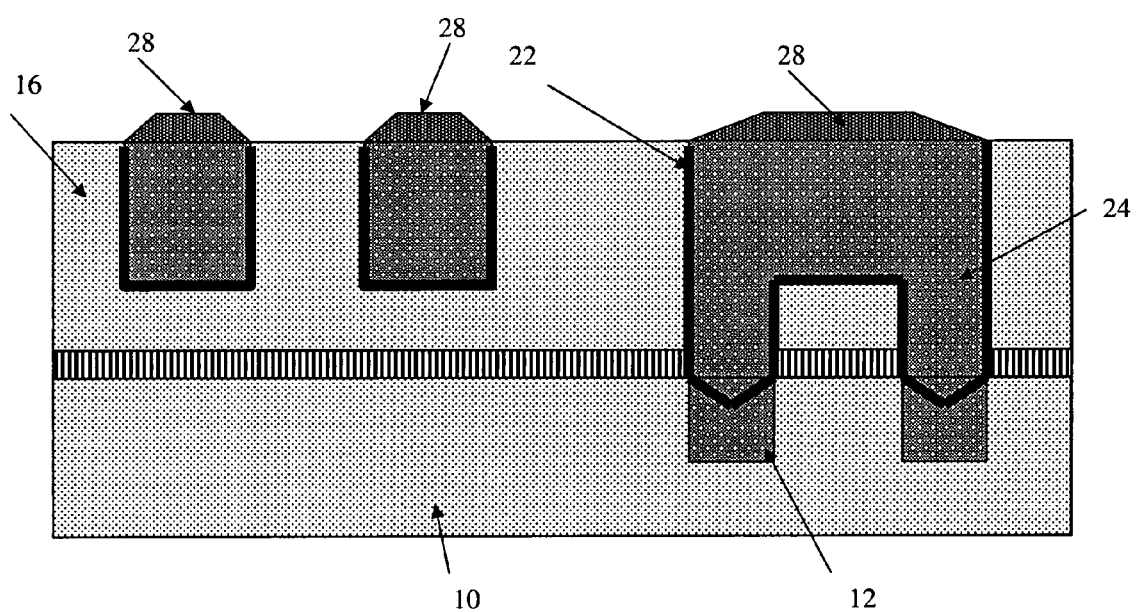
FIG. 7 shows a final structure and respective fabrication processes in accordance with the invention.

FIG. 7 shows a final structure and respective fabrication processes in accordance with the invention. In FIG. 7, the sacrificial layer 26 is removed using various types of processes. In embodiments, it may only be necessary to remove a portion (e.g., an upper most layer) of the sacrificial layer 26, depending on the material properties of the sacrificial layer 26. These material properties may be, for example, compatibility with back of the line material processes, dielectric constant, thermal stability and mechanical properties, to name a few. In any scenario described herein, the removal of the sacrificial layer 26 or a portion thereof, will also result in the removal or undercutting of the unwanted metal or rogue nucleation of the CoWP, CoWB, etc., on the surface of the sacrificial material 26 (and hence the structure).

In embodiments, the sacrificial layer 26 may be removed using any process that is selective to the sacrificial layer 26, while maintaining the integrity of the dielectric, liner and copper materials of the structure. Thus, the removal process should not significantly chemically damage the dielectric, liner and copper materials of the structure. For example, the removal process may be a UV assisted thermal composition process, followed by a solvent or water rinse. Alternatively, a thermal decomposition process followed by a solvent or water rinse may be used to remove the sacrificial layer 26. Depending on the properties of the sacrificial layer 26, the thermal decomposition process can occur at temperatures of greater than 400° C. In alternative methods, the sacrificial layer 26 may be removed by a reducing plasma etch followed by a solvent or water rinse.

Figure 8:
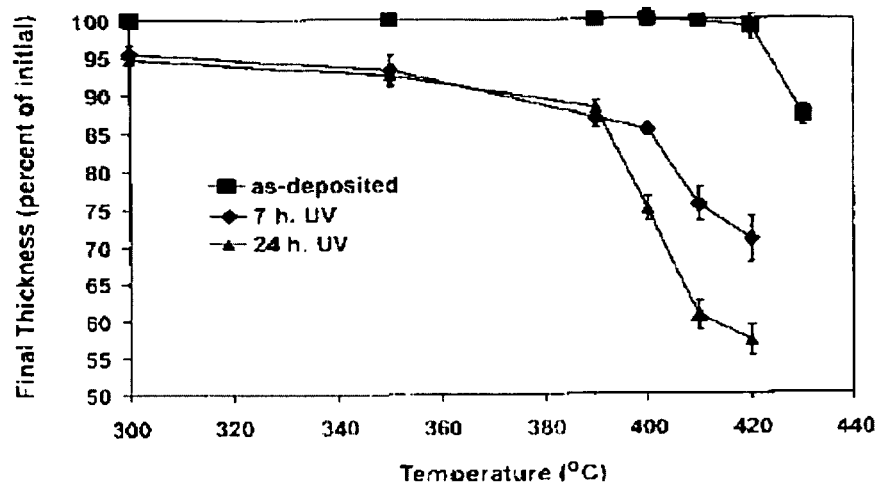
FIG. 8 shows a known thickness of Parylene as a function of temperature, indicating thermal decomposition and UV-assisted thermal decomposition.

FIG. 8 shows a known thickness of Parylene as a function of temperature, indicating thermal decomposition and UV-assisted thermal decomposition. (See, Chemical Vapor Deposition Polymerization: The Growth and Properties of Parylene Thin Films, by Jeffrey B. Fortin and Toh-Ming Lu.) As shown graphically, the thickness of Parylene changes due to degradation from annealing. That is, the thickness of Parylene decreases over time and increased temperature. This same or similar process is also applicable for other sacrificial materials, i.e., decrease of thickness over time and temperature.

Figure 9:
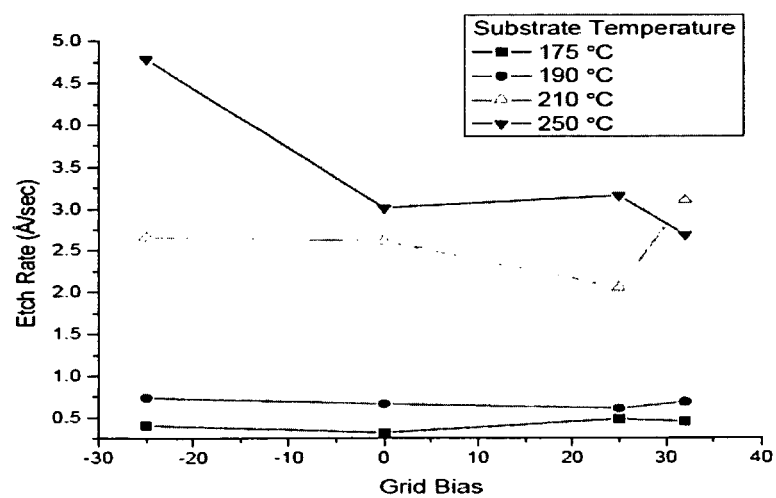
FIG. 9 shows known etch rates of Parylene as a function of temperature.

FIG. 9 shows known etch rates of Parylene as a function of temperature. (See, Atomic Layer Deposition of Metals on Dielectric Substrates, by Gregory A Ten Eyck.) As shown in this graph, using 1.5:1 $N_2:H_2$ plasma etching at 55 W, the etch rate increases as temperature increases. The data of this graph and the graph of FIG. 8 can be used by those of skill in the art to determine appropriate removal rates of Parylene, when practicing the invention.

Figure 10:
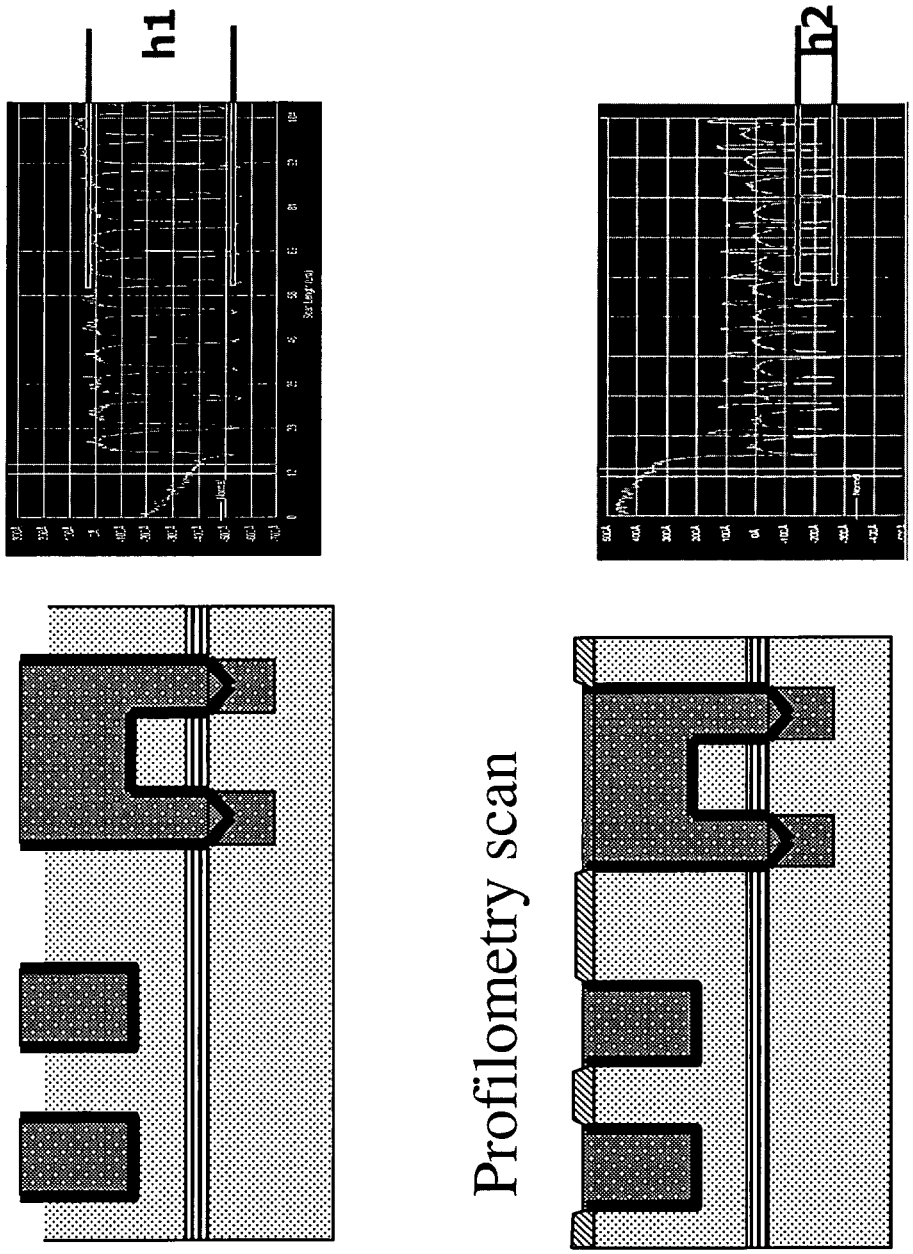
FIG. 10 shows a topography mapping of the structures of FIG. 4 and FIG. 5.

FIG. 10 shows a topography mapping of the structures of FIG. 4 and FIG. 5. It should be realized that after CMP processing, the dielectric layer 16 may be recessed in comparison to the liner 22 and copper 24. As shown experimentally, the sacrificial material 26 is selective to the dielectric layer 16. That is, as shown in FIG. 10 there is a profile change of the structures between the processing steps of FIG. 4 and FIG. 5. This profile change is experimental evidence that the sacrificial material 26 is deposited at a sufficient thickness on the dielectric layer 16 in a quantity thicker than that on the copper material 24. This sacrificial material 26 will protect the structure from unwanted deposition and/or nucleation of the cap material on the surface of the dielectric material. This, in turn, will increase the EM lifetime and reduce the risk of shorting between copper wires and early time dependent dielectric breakdown failure, especially as the structure is scaled.

The methods and structures as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with the structures of the invention) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While the invention has been described in terms of embodiments, those skilled in the art will recognize that the invention can be practiced with modifications and in the spirit and scope of the appended claims.

What is claimed is:

1. A structure, comprising:
a lower dielectric layer having a lower trench filled with a lower conductive layer;
a lower cap layer formed on the lower dielectric layer;
a planarized dielectric layer, formed on the lower cap layer, having an upper trench;
an upper conductive layer formed in the upper trench of the planarized dielectric layer, a top surface of the upper conductive layer being at a coplanar level as a top surface of the planarized dielectric layer;
a via aligned with the lower trench and structured to connect the upper trench with the lower trench, the via being formed through the planarized dielectric is layer and the lower cap layer into the lower conductive layer;

a liner completely lining sidewalls and a bottom of the upper trench and the via, wherein the liner extends through the lower cap layer into and in physical contact with the lower conductive layer, and a bottom surface of a bottom portion of the liner is non-planar and below a top surface of the lower dielectric layer;

a sacrificial layer formed selective to an exposed surface of the planarized dielectric layer;

a cap layer being formed on the conductive layer to prevent migration, the planarized dielectric layer being devoid of the cap layer, and the cap layer being in physical contact with the upper conductive layer; and a plurality of isolated deposits of a nucleated cap material formed on the sacrificial material, wherein the nucleated cap material comprises a same material as the cap layer.

2. The structure of claim 1, wherein the cap layer is one of CoWB and CoWP of different compositions.

3. The structure of claim 1, wherein the liner extends below portions of the lower conductive layer within the upper trench.

4. The structure o f claim 3, wherein the liner is tantalum, tantalum nitride, titanium, titanium nitride or Ruthenium.

5. The structure of claim 1, wherein the planarized dielectric layer is silicon oxide, carbon doped oxide, SiCxOyHz or a porous dielectric material.

6. The structure of claim 1, wherein the upper conductive layer is free of the sacrificial layer.

7. The structure of claim 1, wherein the sacrificial layer has a ratio of deposition rate on the planarized dielectric layer to a deposition rate on copper of about 2 or greater.

8. The structure of claim 1, wherein the sacrificial layer is hydrophobic.

9. The structure of claim 1, wherein the sacrificial layer is a variety of silylating agents.

10. The structure of claim 1, wherein the sacrificial layer is a variety of polyxylylene polymers.

11. The structure of claim 1, wherein the sacrificial layer prevents unwanted deposition and/or rogue nucleation of the cap layer, on the planarized dielectric layer.

12. An intermediate structure, comprising:
a first dielectric layer having a first trench filled with a first conductive layer;
a lower capping layer formed on the first dielectric layer;
a second dielectric layer formed over the first dielectric layer, the second dielectric layer having a via and a second trench, wherein the via and the second trench are lined with a liner and filled with a second conductive layer on the liner, a top surface of the second conductive layer being at a coplanar level as a top surface of the second dielectric layer, the second dielectric layer being devoid of unwanted deposition or nucleation of a capping layer, and the capping layer being on the second conductive layer, wherein:
the liner contacts the first dielectric layer and the first conductive layer;
a bottom portion of the liner extends through the lower capping layer into the first conductive layer; and
a bottom surface of the bottom portion of the liner is non-planar and below a top surface of the first dielectric layer;
a sacrificial layer placed on an entire exposed surface of the second dielectric layer, which prevents the capping layer from depositing on the second dielectric layer, the capping layer being devoid of the sacrificial layer; and a plurality of isolated deposits of a nucleated cap material formed on the sacrificial material,
wherein the nucleated cap material comprises a same material as the cap layer.

13. The intermediate structure of claim 12, wherein the liner is tantalum, tantalum nitride, titanium, titanium nitride or Ruthenium.

14. The intermediate structure of claim 12, wherein the first conductive layer and the second conductive layer are copper.

15. The intermediate structure of claim 12, wherein the sacrificial layer has a ratio of deposition rate on the second dielectric layer to a deposition rate on the second conductive layer of about 2 or greater.

16. The intermediate structure of claim 12, wherein the sacrificial layer is at least one of: hydrophobic and has silylating agents, and a variety of polyxylylene polymers.

17. The intermediate structure of claim 12, wherein the sacrificial layer prevents unwanted deposition and/or rogue nucleation of the capping layer, on the second dielectric layer.

18. The intermediate structure of claim 12, wherein:
the capping layer is one of CoWB and CoWP of different compositions; and
the capping layer is in physical contact with the second conductive layer.

19. The intermediate structure of claim 18, wherein the capping layer is in physical contact with only the second conductive layer.

20. The intermediate structure of claim 19, further comprising: the second dielectric layer formed on the lower capping layer, wherein:
the via aligns with the first trench and connects with the second trench, extends from the second dielectric layer through the lower capping layer and into the first trench;
the liner extends below portions of the second conductive layer within the via and the second trench; and
the second conductive layer extends through the lower capping layer and into the first trench.

21. The structure of claim 1, further comprising a second via aligned with a second lower trench in the lower dielectric layer, and connected to the upper trench, and formed through the planarized dielectric layer and the lower cap layer and into the second lower trench, wherein:
the liner lines sidewalls and a bottom of the second via; and
the upper conductive layer fills the second via.

22. The structure of claim 21, wherein the upper trench, the via, and the second via comprise a continuous feature.

23. The intermediate structure of claim 20, further comprising a second via formed through the second dielectric layer and the lower capping layer and into the first conductive layer, wherein:
the liner lines sidewalls and a bottom of the second via; and
the second conductive layer fills the second via.

24. The intermediate structure of claim 23, wherein the second trench, the via, and the second via comprise a continuous feature.

25. A structure, comprising:
a first dielectric layer;
an intermediate cap layer formed on the first dielectric layer;
a second dielectric layer formed over the first dielectric layer;
a conductive layer formed in a trench of the second dielectric layer, a top surface of the conductive layer being at a coplanar level as a top surface of the second dielectric layer;

a liner completely lining sidewalls and a bottom of the trench, and in direct contact with the second dielectric layer, wherein:
- the liner contacts a lower conductive layer within a trench formed in the first dielectric layer;
- a bottom portion of the liner extends through the intermediate cap layer into the lower conductive layer; and
- a bottom surface of the bottom portion of the liner is non-planar and below a top surface of the first dielectric layer;

a sacrificial layer formed on an exposed surface of the second dielectric layer;

a cap layer being formed on the conductive layer to prevent migration, the second dielectric layer being devoid of the cap layer; and a nucleated cap material of a same material as the cap layer being formed on the sacrificial layer, wherein:
- the sacrificial layer prevents the cap layer from being depositing on the second dielectric layer; and
- the nucleated cap material provides an un-continuous coverage of an entire surface of the sacrificial layer.

26. The structure of claim 25, wherein the top surface of the second dielectric layer is devoid of the liner.

27. The structure of claim 26, wherein a top surface of the liner is coplanar with the top surface of the conductive layer and the top surface of the second dielectric layer.

* * * * *